United States Patent
Zhao et al.

(10) Patent No.: US 10,912,200 B2
(45) Date of Patent: *Feb. 2, 2021

(54) PLUGGABLE PRINTED CIRCUIT BOARD AND OPTICAL MODULE HAVING A GAP BETWEEN SOLDER RESIST AND ELECTRO-CONDUCTIVE CONTACT SHEET GROUP

(71) Applicants: HISENSE BROADBAND MULTIMEDIA TECHNOLOGIES CO., LTD., Qingdao (CN); HISENSE USA CORORATION, Suwanee, GA (US); HISENSE INTERNATIONAL CO., LTD., Shandong (CN)

(72) Inventors: Wei Zhao, Qingdao (CN); Wei Cui, Qingdao (CN); Lin Yu, Qingdao (CN)

(73) Assignees: Hisense Broadband Multimedia Technologies Co., Ltd., Shandong (CN); Hisense USA Corporation, Suwanee, GA (US); Hisense International Co., Ltd., Shandong (CN)

( * ) Notice: Subject to any disclaimer, the term of this patent is extended or adjusted under 35 U.S.C. 154(b) by 362 days.

This patent is subject to a terminal disclaimer.

(21) Appl. No.: 15/982,240

(22) Filed: May 17, 2018

(65) Prior Publication Data
US 2018/0270954 A1    Sep. 20, 2018

Related U.S. Application Data

(63) Continuation of application No. 15/258,330, filed on Sep. 7, 2016, now Pat. No. 9,999,130.

(30) Foreign Application Priority Data

Dec. 21, 2015  (CN) .......................... 2015 1 0968955
Dec. 21, 2015  (CN) ..................... 2015 2 1076075 U

(51) Int. Cl.
*H05K 1/11*     (2006.01)
*H05K 1/18*     (2006.01)
(Continued)

(52) U.S. Cl.
CPC ............. *H05K 1/18* (2013.01); *H05K 1/0298* (2013.01); *H05K 1/117* (2013.01); *H05K 3/3452* (2013.01);
(Continued)

(58) Field of Classification Search
CPC ........ H05K 1/0298; H05K 1/18; H05K 1/117; H05K 3/3452
(Continued)

(56) References Cited

U.S. PATENT DOCUMENTS

| 5,266,748 A | 11/1993 | Kawakami et al. |
| 6,937,480 B2 * | 8/2005 | Iguchi .................. H05K 1/0216 174/255 |
| 2015/0075851 A1 | 3/2015 | Kaneko et al. |

FOREIGN PATENT DOCUMENTS

| CN | 201066955 Y | 5/2008 |
| CN | 101365299 A | 2/2009 |

(Continued)

OTHER PUBLICATIONS

Office Action from Chinese Application No. 201510968955.0 dated Dec. 4, 2018 (5 pages).
(Continued)

*Primary Examiner* — Que Tan Le
(74) *Attorney, Agent, or Firm* — Harness, Dickey & Pierce, P.L.C.

(57) ABSTRACT

The application provides a printed circuit board and an optical module so as to alleviate poor contact between the electro-conductive contact sheet group and the clamping piece due to the solder resist. The printed circuit board
(Continued)

includes a substrate, and electro-conductive contact sheet group positioned on the surface of the substrate, where a part of the substrate is overlaid with solder resist, and there is a gap between the solder resist and the electro-conductive contact sheet group.

20 Claims, 3 Drawing Sheets

(51) Int. Cl.
  *H05K 1/02* (2006.01)
  *H05K 3/34* (2006.01)
(52) U.S. Cl.
  CPC ........... *H05K 2201/0137* (2013.01); *H05K 2201/10121* (2013.01)
(58) Field of Classification Search
  USPC ..................................................... 250/214 R
  See application file for complete search history.

(56) References Cited

FOREIGN PATENT DOCUMENTS

| | | |
|---|---|---|
| CN | 202434238 U | 9/2012 |
| CN | 205454216 U | 8/2016 |

OTHER PUBLICATIONS

Office Action from Chinese Application No. 201510968955.0 dated Jul. 2, 2019 (5 pages).

\* cited by examiner

_(1)_

PLUGGABLE PRINTED CIRCUIT BOARD AND OPTICAL MODULE HAVING A GAP BETWEEN SOLDER RESIST AND ELECTRO-CONDUCTIVE CONTACT SHEET GROUP

CROSS REFERENCE TO RELATED APPLICATIONS

This application is a continuation of the U.S. patent application Ser. No. 15/258,330 filed Sep. 7, 2016, which claims the benefit and priority of Chinese Application No. 201510968955.0 filed Dec. 21, 2015, and Chinese Application No. 201521076075.4 filed Dec. 21, 2015. The entire disclosures of the above applications are incorporated herein by reference.

FIELD

The present disclosure relates to the field of optical modules, and particularly to a printed circuit board and an optical module.

BACKGROUND

This section provides background information related to the present disclosure which is not necessarily prior art.

A Printed Circuit Board (PCB), also referred to as a printed wiring board, is fabricated by forming at least one conductive pattern on an insulation plate with some size which is a base material, and arranging holes (such as component hole, fastener hole and plated through hole, etc.) in the conductive pattern instead of pads of electronic elements in a legacy device so that the electronic elements are interconnected.

The electro-conductive contact sheets have been widely applied to pluggable printed circuit boards, e.g., memory banks, display cards, etc., due to their high anti-oxidation, high abrasive resistance, and high electric conductivity, where they are connection members between the printed circuit boards and the slots to bring the printed circuit boards into electrical contact with other electronic components. A solder resist is a protective layer coated on those wirings and base material segments of the printed circuit board which need not to be soldered, for the purpose of protecting the formed wiring pattern for a long period of time.

SUMMARY

This section provides a general summary of the disclosure, and is not a comprehensive disclosure of its full scope or all of its features.

Some embodiments of the application provide a printed circuit board including:
 a substrate, and
 an electro-conductive contact sheet group;
 where the electro-conductive contact sheet group is positioned on a surface of the substrate, a part of the substrate is overlaid with solder resist, and there is a gap between the solder resist and the electro-conductive contact sheet group.

Some embodiments of the application provide an optical module including:
 an optical transmitter,
 an optical receiver, and
 a printed circuit board;
 where the printed circuit board includes:
 a substrate, and
 an electro-conductive contact sheet group;
 where electro-conductive contact sheet group is positioned on a surface of the substrate, a part of the substrate is overlaid with solder resist, and there is a gap between the solder resist and the electro-conductive contact sheet group.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Example embodiments will now be described more fully with reference to the accompanying drawings. Some embodiments of the application provide a printed circuit board generally applicable to the field of optical modules.

Figure 1:
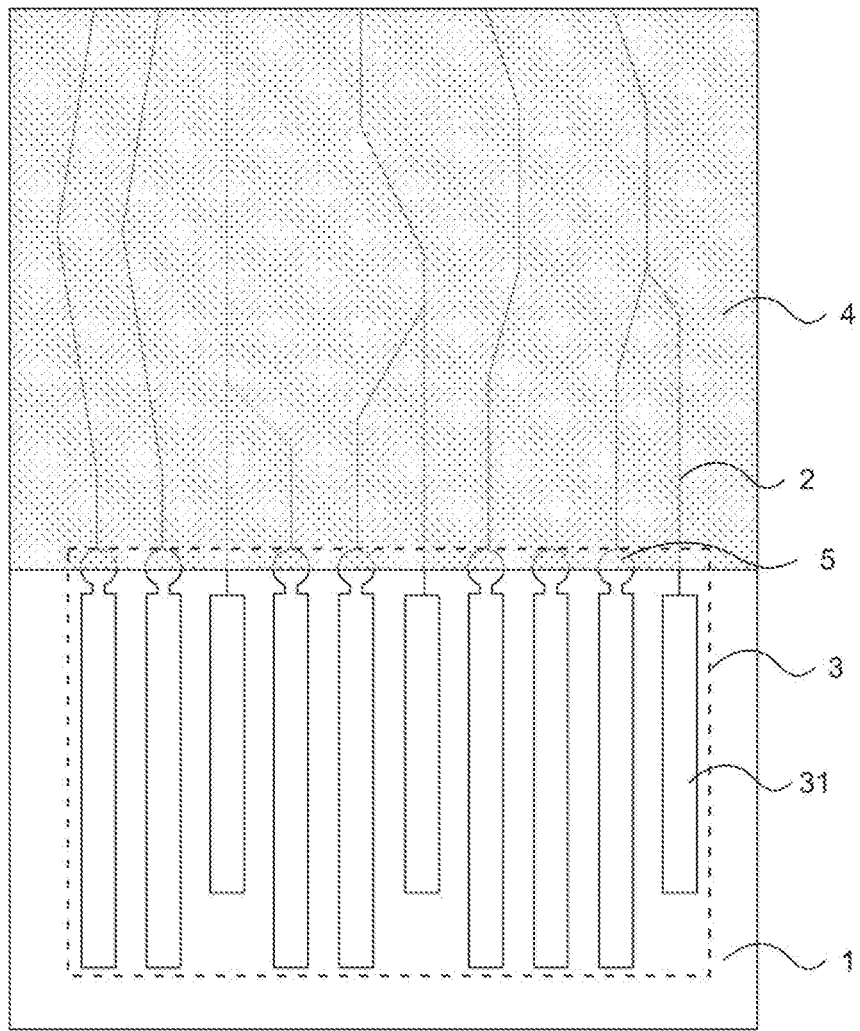
FIG. 1 is a schematic diagram of an SFP-type printed circuit board according to some embodiments of the application.

FIG. 1 illustrates a schematic front view of a printed circuit board according to some embodiments of the application. As illustrated in FIG. 1, the printed circuit board includes a substrate 1, and electro-conductive wirings 2 and an electro-conductive contact sheet group 3, which are both positioned on the surface of the substrate, where the electro-conductive contact sheet group 3 includes at least one electro-conductive contact sheet 31, a part of the substrate 1 is covered with solder resist 4 overlying the substrate 1 and the electro-conductive wirings 2, the thickness of the solder resist 4 is more than that of the electro-conductive contact sheets, and the solder resist 4 does not contact the electro-conductive contact sheet group 3. In FIG. 1, a part of the electro-conductive wirings 2 are covered with the solder resist 4.

In the printed circuit board according to some embodiments of the application, there is a gap between the solder resist and the electro-conductive contact sheet group so that the distance between the solder resist, and the bottom of the printed circuit board is more than the length of a clamping piece in a slot. In this way, if an electro-conductive contact sheet group is clamped by the clamping piece, then the clamping piece will not come into contact with the solder resist overlying the printed circuit board to thereby avoid the insulating solder resist from existing between the clamping piece in the slot, and the electro-conductive contact sheet group so as to alleviate poor contact between the clamping piece and the electro-conductive contact sheet group due to the solder resist, which would otherwise hinder the printed circuit board from coming into electrical contact with another electronic component.

Figure 2:
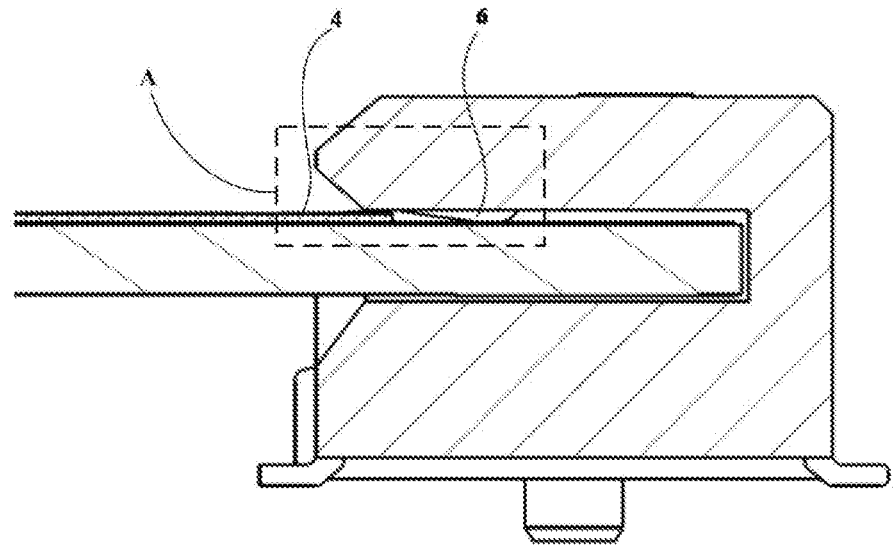
FIG. 2 is a section view of a printed circuit board and a slot according to some embodiments of the application.
Figure 3:
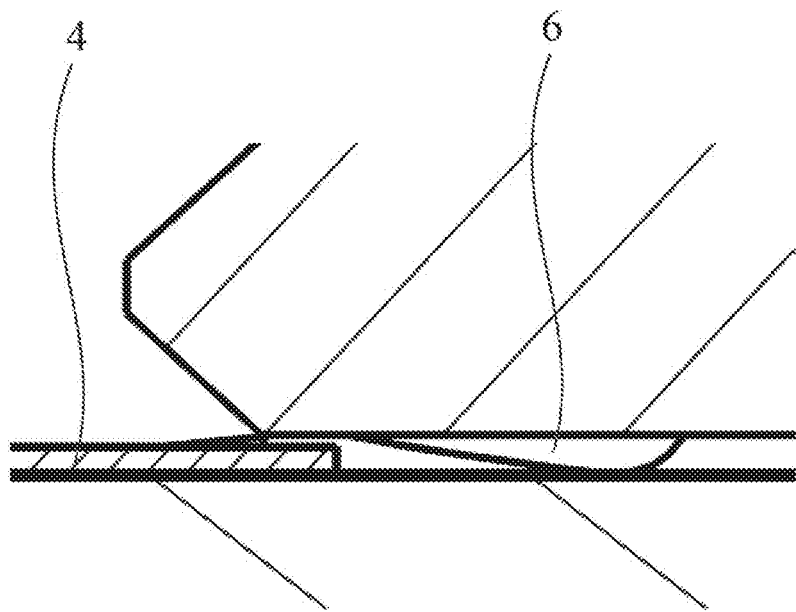
FIG. 3 is an enlarged view of section A in FIG. 2.

In some embodiments, some of the electro-conductive contact sheets in the electro-conductive contact sheet group of the printed circuit board may be arranged with extending-out sections, and as illustrated in FIG. 1, for example, there is a Small Form factor Pluggable (SFP) circuit board, where some electro-conductive contact sheets are arranged with extending-out sections 5. If the solder resist 4 covers the whole extending-out sections 5 of the electro-conductive contact sheet group, since the extending-out sections 5 is in the same thickness as the electro-conductive contact sheets, then the resulting thickness of the solder resist 4 and the extending-out sections 5 will be significantly more than the thickness of the electro-conductive contact sheets 31, so that if the electro-conductive contact sheet group will be clamped at the section covered by the solder resist 4 when being clamped by the clamping piece 6 in the external slot, thus resulting in poor contact between the electro-conductive contact sheet group and the external slot due to the insulativity of the solder resist. Thus in some embodiments of the application, decreasing the area of the solder resist 4 coated on the printed circuit board, for example, the solder resist 4 covers a part of the extending-out sections 5 of the electro-conductive contact sheet group 3 as illustrated in FIG. 1, so that there is a gap between the solder resist 4 and the electro-conductive contact sheet group 3 to thereby avoid the solder resist 4 from coming into contact with the clamping piece 6 in the external slot, as illustrated in FIG. 2 and FIG. 3, thus addressing the problem of poor contact between the electro-conductive contact sheet group and the clamping piece due to the solder resist.

Figure 4:
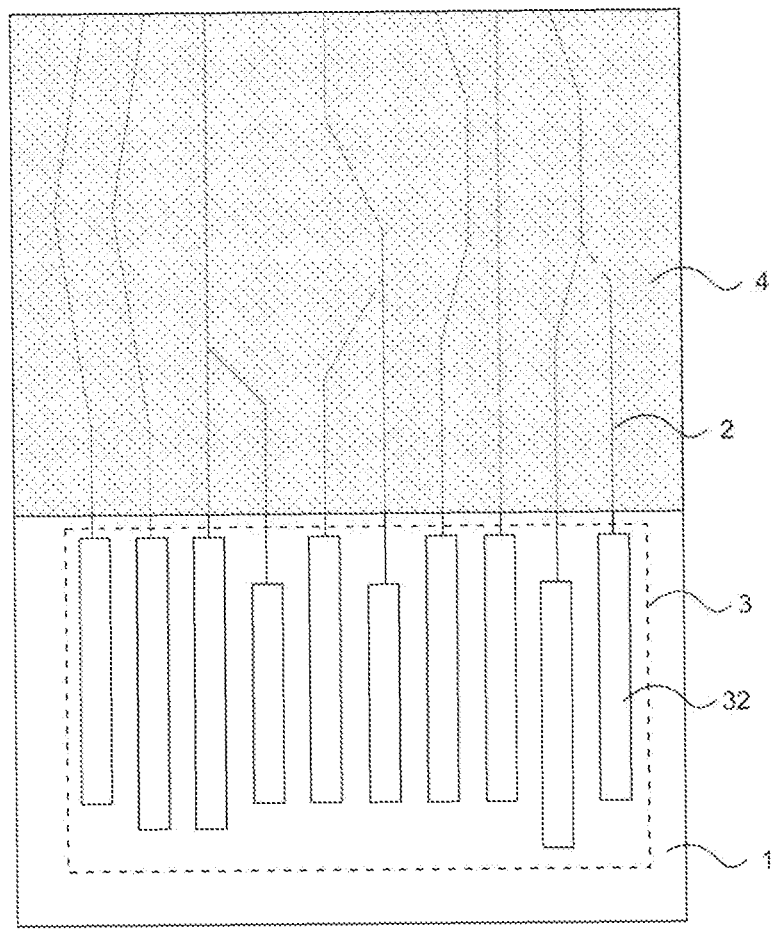
FIG. 4 is a schematic diagram of an XFP-type printed circuit board according to some embodiments of the application.

In some embodiments, if some of the electro-conductive contact sheets 31 in the electro-conductive contact sheet group on the printed circuit board are arranged with the extending-out sections 5, then the extending-out sections 5 of the electro-conductive contact sheets 31 will be covered by the solder resist; and in some embodiments, if none of the electro-conductive contact sheets in the electro-conductive contact sheet group on the printed circuit board is arranged with the extending-out section 5, then the electro-conductive wirings connected with the electro-conductive contact sheets will be covered by the solder resist. As illustrated in FIG. 4, the electro-conductive contact sheets 32 is included in the electro-conductive contact sheet group 3, where the electro-conductive contact sheets 32 are not covered by the solder resist 4, and a part of the electro-conductive wirings 2 connected with the electro-conductive contact sheets 32 is covered by the solder resist 4. Since the thickness of the electro-conductive contact sheets 32 is almost equal to the thickness of the electro-conductive wirings 2 (where the difference between the thickness of the electro-conductive contact sheets 32 and the thickness of the electro-conductive wirings 2 is no more than 5 μm), the electro-conductive wirings 2 covered with the solder resist may also hinder the electro-conductive contact sheet group 3 from coming into contact with the clamping pieces 6, so the area where the solder resist 4 is covered will also be decreased so that there is a gap between the solder resist 4 and the electro-conductive contact sheets 32 to thereby prevent the clamping piece 6 from clamping the solder resist 4.

If some electro-conductive wirings on the printed circuit board are not covered by the solder resist, then the extending-out sections 5 on the electro-conductive contact sheets 31 will not be covered by the solder resist either. Since the thickness of the coated solder resist is more than the thickness of the electro-conductive contact sheets 31, although the electro-conductive contact sheet group is coated with the solder resist up to the edge thereof, the part of the solder resist above the height of the electro-conductive contact sheet group may still result in poor contact between the electro-conductive contact sheet group being clamped by the clamping piece 6, and the external slot.

The solder resist is widely used in the printed circuit board; for example, all the wirings and copper surfaces can be covered by the solder resist to prevent short circuit while soldering, and to ensure the sections to be soldered as desired to thereby avoid a waste of solders; in another example, the wirings can be prevented from being oxidized due to intruding of humidity and various electrolytes, which would otherwise endanger the electrical characteristics, and the printed circuit board can be prevented from being damaged mechanically from the outside to thereby maintain good performance of the surface of the board; and in still another example, the issue of insulation between conductors have become increasingly serious as the width of lines on the printed circuit board is decreasing, and the highly insulating solder resist can facilitate dense deployment of circuits. Moreover the sections of the electro-conductive wirings covered with the solder resist are different in impendence from the sections of the electro-conductive wirings which are not covered with the solder resist, thus resulting in varying impedance of the electro-conductive wirings 2, which may have some influence on transmission of a signal, where the sections of the electro-conductive wirings which are not covered with the solder resist are longer, the influence upon the impedance will be larger. Thus the distance between the solder resist 4 and the electro-conductive contact sheet group 3 shall not be too large. On the other hand, in some embodiments of the application, the distance between the solder resist 4 and the electro-conductive contact sheet group 3 is in a range between 0.6 mm to 1 mm due to an error in fabricating the clamping piece in the external slot, an error in fabricating the electro-conductive contact sheet group, and other errors in designing and fabricating. For example, the distance between the solder resist 4 and the electro-conductive contact sheet group 3 is 0.8 mm, where the distance between the solder resist and the electro-conductive contact sheet group refers to the distance between the solder resist, and the end of the electro-conductive contact sheet group close to the solder resist.

Since the electro-conductive contact sheet group consists of a number of electro-conductive contact sheets, the distance between the solder resist and the electro-conductive contact sheet group may be defined differently for different types of printed circuit boards. For example, all the electro-conductive contact sheets on the electro-conductive contact sheet group in the SFP-type printed circuit board have the same length, and the distance between each electro-conductive contact sheet and the solder resist (the distance between the electro-conductive contact sheet and the solder resist refers to the distance between the end of the electro-conductive contact sheet close to the solder resist, and the solder resist) is also the same, so the distance between the solder resist and the electro-conductive contact sheet group refers to the distance between the solder resist and any one of the electro-conductive contact sheets as illustrated in FIG. 3. The electro-conductive contact sheets of the electro-conductive contact sheet group in an 10 Gigabit Small Form Factor Pluggable (XFP)-type printed circuit board are different in length, thus the distances between the electro-conductive contact sheets and the solder resist are also different, so the distance between the solder resist and the electro-conductive contact sheet group refers to the largest one of the distances between the electro-conductive contact sheets and the solder resist as illustrated in FIG. 4, where there are different lengths of the electro-conductive contact sheets of the electro-conductive contact sheet group 3, and if there is the largest distance between the end of the fourth electro-conductive contact sheet starting from the left in FIG. 4, close to the solder resist, and the solder resist, then the distance between the solder resist and the electro-conductive contact sheet group 3 at this time will be the distance between the solder resist and the fourth electro-conductive contact sheet, where the distance between the solder resist and any one of the electro-conductive contact sheets of the electro-conductive contact sheet group ranges from 0.6 mm to 1 mm.

In some embodiments of the application, the solder resist is liquid photoinduced solder resist, and furthermore the liquid photoinduced solder resist is green liquid photoinduced solder resist.

In some embodiments of the application, there is a gap between the solder resist and the electro-conductive contact sheet group, so that if an electro-conductive contact sheet group is clamped by the clamping piece in the external slot, then the clamping piece will not come into contact with the solder resist overlying the printed circuit board to thereby avoid the insulating solder resist from existing between the clamping piece, and the electro-conductive contact sheet group so as to address the problem of poor contact between the clamping piece and the electro-conductive contact sheet group due to the solder resist, which would otherwise hinder the printed circuit board from coming into electrical contact with another electronic component.

Figure 5:
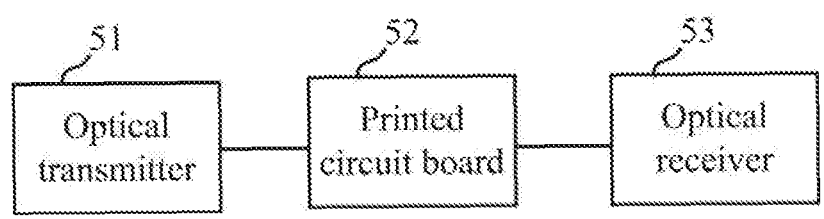
FIG. 5 is a schematic structural diagram of an optical module according to some embodiments of the application.

FIG. 5 illustrates a schematic structural diagram of an optical module according to some embodiments of the application. As illustrated in FIG. 5, the optical module includes an optical transmitter 51, a printed circuit board 52, and an optical receiver 53, where the optical transmitter 51 and the optical receiver 53 are connected respectively with the printed circuit board 52; and the printed circuit board 52 includes a substrate, electro-conductive wirings and electro-conductive contact sheet group both positioned on the surface of the substrate, and the substrate is overlaid with solder resist, where the thickness of the solder resist is more than the thickness of the electro-conductive contact sheet group, and the solder resist has no contact with the electro-conductive contact sheet group.

The structure of the printed circuit board 52 may refer to FIG. 1 to FIG. 4, so a repeated description thereof will be omitted here.

In some embodiments, in the case that a part of the substrate is overlaid with the solder resist, it is a part of the electro-conductive wirings thereon that is overlaid with the solder resist, and the thickness of the electro-conductive wirings is almost equal to the thickness of the electro-conductive contact sheet group, where the difference between the thickness of the electro-conductive wirings and the thickness of the electro-conductive contact sheet group is no more than 5 μm.

In some embodiments, in the case that a part of the substrate is overlaid with the solder resist, the electro-conductive wirings thereon are not overlaid with the solder resist.

In some embodiments, the solder resist does not contact the electro-conductive contact sheet group, and the distance between the solder resist and the electro-conductive contact sheet group may be in a range between 0.6 mm to 1 mm; and in at least one embodiment, the distance between the solder resist and the electro-conductive contact sheet group may be 0.8 mm.

In some embodiments, the electro-conductive contact sheet group includes a number of electro-conductive contact sheets having the same length, and the distance between the solder resist and the electro-conductive contact sheet group is the distance between the solder resist and any one of the electro-conductive contact sheets.

In some embodiments, the electro-conductive contact sheet group includes a number of electro-conductive contact sheets having different lengths, and the distance between the solder resist and the electro-conductive contact sheet group is the largest one of the distances between the solder resist and the electro-conductive contact sheets.

In some embodiments, the solder resist is liquid photoinduced solder resist, where the liquid photoinduced solder resist may be green liquid photoinduced solder resist.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A printed circuit board, comprising:
a substrate; and
an electro-conductive contact sheet group;
wherein the electro-conductive contact sheet group is positioned on a surface of the substrate, a part of the substrate is overlaid with solder resist, and there is a gap between the solder resist and the electro-conductive contact sheet group.

2. The printed circuit board according to claim 1, wherein a thickness of the solder resist is more than a thickness of the electro-conductive contact sheet group.

3. The printed circuit board according to claim 1, wherein the printed circuit board further comprises electro-conductive wirings positioned on the surface of the substrate, and a part of the electro-conductive wirings positioned on the surface of the substrate is overlaid with the solder resist.

4. The printed circuit board according to claim 3, wherein a thickness of the electro-conductive wirings is almost equal to a thickness of the electro-conductive contact sheet group.

5. The printed circuit board according to claim 1, wherein the printed circuit board further comprises electro-conductive wirings positioned on the surface of the substrate, and the electro-conductive wirings positioned on the surface of the substrate are not overlaid with the solder resist.

6. The printed circuit board according to claim 1, wherein a width of the gap between the solder resist and the electro-conductive contact sheet group is in a range between 0.6 mm to 1 mm.

7. The printed circuit board according to claim 6, wherein the width of the gap between the solder resist and the electro-conductive contact sheet group is almost 0.8 mm.

8. The printed circuit board according to claim 6, wherein the electro-conductive contact sheet group comprises a number of electro-conductive contact sheets having a same length, and the distance between the solder resist and the electro-conductive contact sheet group refers to a distance between the solder resist and any one of the electro-conductive contact sheets.

9. The printed circuit board according to claim 6, wherein the electro-conductive contact sheet group comprises a number of electro-conductive contact sheets having different lengths, and the distance between the solder resist and the electro-conductive contact sheet group refers to a largest one of distances between the solder resist and the electro-conductive contact sheets.

10. The printed circuit board according to claim 1, wherein the solder resist is liquid photoinduced solder resist.

11. The printed circuit board according to claim 10, wherein the liquid photoinduced solder resist is green liquid photoinduced solder resist.

12. An optical module, comprising:
an optical transmitter;
an optical receiver; and
a printed circuit board, wherein the printed circuit board comprises a substrate, and an electro-conductive contact sheet group;
wherein the electro-conductive contact sheet group is positioned on a surface of the substrate, a part of the substrate is overlaid with solder resist, and there is a gap between the solder resist and the electro-conductive contact sheet group.

13. The optical module according to claim 12, wherein a thickness of the solder resist is more than a thickness of the electro-conductive contact sheet group.

14. The optical module according to claim 12, wherein the printed circuit board further comprises electro-conductive wirings positioned on the surface of the substrate, and a part of the electro-conductive wirings is overlaid with the solder resist.

15. The optical module according to claim 14, wherein a thickness of the electro-conductive wirings is almost equal to a thickness of the electro-conductive contact sheet group.

16. The optical module according to claim 12, wherein the printed circuit board further comprises electro-conductive wirings positioned on the surface of the substrate, and the electro-conductive wirings are not overlaid with the solder resist.

17. The optical module according to claim 12, wherein a width of the gap between the solder resist and the electro-conductive contact sheet group is in a range between 0.6 mm to 1 mm.

18. The optical module according to claim 17, wherein the width of the gap between the solder resist and the electro-conductive contact sheet group is 0.8 mm.

19. The optical module according to claim 17, wherein the electro-conductive contact sheet group comprises a number of electro-conductive contact sheets having a same length, and the distance between the solder resist and the electro-conductive contact sheet group refers to a distance between the solder resist and any one of the electro-conductive contact sheets.

20. The optical module according to claim 17, wherein the electro-conductive contact sheet group comprises a number of electro-conductive contact sheets having different lengths, and the distance between the solder resist and the electro-conductive contact sheet group refers to a largest one of distances between the solder resist and the electro-conductive contact sheets.

* * * * *